(12) United States Patent
Zhao

(10) Patent No.: US 11,069,760 B2
(45) Date of Patent: Jul. 20, 2021

(54) DISPLAY DEVICE WITH THROUGH HOLE DEFINED IN ELECTRONIC ELEMENT SETUP REGION CORRESPONDING TO ELECTRONIC ELEMENTS

(71) Applicant: Wuhan China Star Optoelectronics Semiconductor Display Technology Co., Ltd., Hubei (CN)

(72) Inventor: Jinrong Zhao, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 58 days.

(21) Appl. No.: 16/622,848

(22) PCT Filed: Nov. 6, 2019

(86) PCT No.: PCT/CN2019/115877
§ 371 (c)(1),
(2) Date: Dec. 13, 2019

(87) PCT Pub. No.: WO2021/027101
PCT Pub. Date: Feb. 18, 2021

(65) Prior Publication Data
US 2021/0043704 A1 Feb. 11, 2021

(30) Foreign Application Priority Data
Aug. 9, 2019 (CN) .......................... 201910734779.2

(51) Int. Cl.
*H01L 27/32* (2006.01)
*H01L 51/52* (2006.01)

(52) U.S. Cl.
CPC ...... *H01L 27/3246* (2013.01); *H01L 27/3227* (2013.01); *H01L 51/5237* (2013.01); *H01L 51/5284* (2013.01)

(58) Field of Classification Search
CPC combination set(s) only.
See application file for complete search history.

(56) References Cited

U.S. PATENT DOCUMENTS

| 2018/0158877 A1* | 6/2018 | Zeng | G06K 9/0004 |
| 2018/0270403 A1* | 9/2018 | Chung | H04N 5/2256 |
| 2019/0180073 A1 | 6/2019 | Zhang et al. |

(Continued)

FOREIGN PATENT DOCUMENTS

| CN | 107994034 A | 5/2018 |
| CN | 109119446 A | 1/2019 |

(Continued)

*Primary Examiner* — Nduka E Ojeh

(57) ABSTRACT

A display panel and a display device are provided. Through disposing the through hole in at least one of the driving circuit layer, the planarization layer, the pixel definition layer, and the common electrode layer of the display panel and in the electronic element setup region disposed corresponding to the electronic elements, external light may directly pass through a layer of film having the through hole when passing through the display panel. Light transparency is thus improved, and the technical problem that poor transparency exists in conventional flexible display screens is solved.

10 Claims, 7 Drawing Sheets

(56) References Cited

U.S. PATENT DOCUMENTS

| | | | | |
|---|---|---|---|---|
| 2019/0208044 A1* | 7/2019 | Lee | ................ | G06F 1/1684 |
| 2020/0328257 A1* | 10/2020 | Kim | ................ | H01L 27/3248 |
| 2020/0365667 A1* | 11/2020 | Jo | ................ | H01L 27/3272 |
| 2020/0373372 A1* | 11/2020 | Chung | ................ | H01L 27/3272 |
| 2020/0381492 A1* | 12/2020 | Ryu | ................ | H01L 27/3246 |

FOREIGN PATENT DOCUMENTS

| | | |
|---|---|---|
| CN | 110010665 A | 7/2019 |
| CN | 110012136 A | 7/2019 |
| CN | 110071150 A | 7/2019 |
| CN | 110491910 A | 11/2019 |

\* cited by examiner

DISPLAY DEVICE WITH THROUGH HOLE DEFINED IN ELECTRONIC ELEMENT SETUP REGION CORRESPONDING TO ELECTRONIC ELEMENTS

FIELD AND BACKGROUND OF THE INVENTION

The present disclosure relates to the field of display technology, and more particularly, to a display panel and a display device.

For conventional flexible, foldable mobile phones, sensors are disposed at the back of flexible display screens in order to realize the function of turning on/off screen automatically, that is, the flexible display screens are turned off when the flexible, foldable mobile phones are folded without use, and the flexible display screens work when the flexible, foldable mobile phones are opened.

As shown in FIG. 1, a conventional flexible display screen includes a substrate, a blocking layer, a buffer layer, an active layer, a first gate insulating layer, a first metal layer, a second gate insulating layer, a second metal layer, an interlayer insulating layer, a source-and-drain electrode layer, a planarization layer, an anode layer, a pixel definition layer, spacers, a light-emitting layer, a cathode layer, and an encapsulation layer. A sensor is disposed at the back of the flexible display screen. Light transmitted from the outside of the encapsulation layer is absorbed, reflected, refracted, and scattered by inorganic films and organic layers, incurring a loss of light and thus affecting the performance of the sensor.

Therefore, there exists a technical problem of poor transparency in conventional flexible display screens.

SUMMARY OF THE INVENTION

A technical problem is that the present disclosure provides a display panel and a display device to solve a technical problem of poor transparency in conventional flexible display screens.

In order to solve the above problem, the present disclosure provides a technical solution as follows:

The present disclosure provides a display panel, including:

a substrate;

a driving circuit layer disposed on the substrate;

a planarization layer disposed on the driving circuit layer;

a pixel electrode layer disposed on the planarization layer;

a pixel definition layer disposed on the pixel electrode layer and defining a light-emitting region;

a light-emitting material layer disposed in the light-emitting region defined by the pixel definition layer; and a common electrode layer disposed on the light-emitting material layer;

wherein in at least one of the driving circuit layer, the planarization layer, the pixel definition layer, and the common electrode layer, a through hole is disposed in an electronic element setup region disposed corresponding to electronic elements.

In the display panel of the present disclosure, a first through hole is disposed in the electronic element setup region and in the common electrode layer.

In the display panel of the present disclosure, the first through hole passes through the common electrode layer to form a first via-hole.

In the display panel of the present disclosure, a second through hole is disposed in the electronic element setup region and in the pixel definition layer.

In the display panel of the present disclosure, the second through hole passes through the pixel definition layer to form a second via-hole.

In the display panel of the present disclosure, a third through hole is disposed in the electronic element setup region and in the planarization layer.

In the display panel of the present disclosure, the third through hole passes through the planarization layer to form a third via-hole.

In the display panel of the present disclosure, a first via-hole is disposed in the electronic element setup region and in the common electrode layer, a second via-hole is disposed in the electronic element setup region and in the pixel definition layer, a third via-hole is disposed in the electronic element setup region and in the planarization layer, and projections of the first via-hole, the second via-hole, and the third via-hole on the substrate overlap each other.

In the display panel of the present disclosure, a fourth via-hole is disposed in the driving circuit layer, and projections of the first via-hole, the second via-hole, the third via-hole, and the fourth via-hole on the substrate overlap each other.

In the display panel of the present disclosure, a cross-sectional area of the fourth via-hole is greater than a cross-sectional area of the third via-hole, a cross-sectional area of the third via-hole is greater than a cross-sectional area of the second via-hole, and a cross-sectional area of the second via-hole is greater than a cross-sectional area of the first via-hole.

In the display panel of the present disclosure, the first via-hole, the second via-hole, and the third via-hole are filled with an encapsulation layer.

In the display panel of the present disclosure, a material of the pixel definition layer includes a light-absorbing organic material.

In the display panel of the present disclosure, a material of the planarization layer includes a light-absorbing organic material.

In the display panel of the present disclosure, the display panel further includes a light-shielding layer disposed between the substrate and the driving circuit layer, wherein a fifth via-hole is disposed in the electronic element setup region and in the light-shielding layer.

In the display panel of the present disclosure, a material of the light-shielding layer includes metal.

In the display panel of the present disclosure, a first pixel and a second pixel are disposed in the second display region, and the through hole is disposed in the electronic element setup region corresponding to the first pixel but not the electronic element setup region corresponding to the second pixel.

Also, the present disclosure provides a display device, including a display panel and electronic elements, wherein the display panel includes:

a substrate;

a driving circuit layer disposed on the substrate;

a planarization layer disposed on the driving circuit layer;

a pixel electrode layer disposed on the planarization layer;

a pixel definition layer disposed on the pixel electrode layer and defining a light-emitting region;

a light-emitting material layer disposed in the light-emitting region defined by the pixel definition layer; and a common electrode layer disposed on the light-emitting material layer;

wherein in at least one of the driving circuit layer, the planarization layer, the pixel definition layer, and the common electrode layer, a through hole is disposed in an electronic element setup region disposed corresponding to the electronic elements.

In the display device of the present disclosure, the electronic elements include a light sensor.

In the display device of the present disclosure, the light sensor is integrated below the substrate.

In the display device of the present disclosure, a first via-hole is disposed in the electronic element setup region and in the common electrode layer, a second via-hole is disposed in the electronic element setup region and in the pixel definition layer, a third via-hole is disposed in the electronic element setup region and in the planarization layer, and projections of the first via-hole, the second via-hole, and the third via-hole on the substrate overlap each other.

The beneficial effect of the present disclosure is that the present disclosure provides a display panel and a display device. The display panel includes a substrate, a driving circuit layer, a planarization layer, a pixel electrode layer, a pixel definition layer, a light-emitting material layer, and a common electrode layer. The driving circuit layer is disposed on the substrate. The planarization layer is disposed on the driving circuit layer. The pixel electrode layer is disposed on the planarization layer. The pixel definition layer is disposed on the pixel electrode layer and defines a light-emitting region. The light-emitting material layer is disposed in the light-emitting region defined by the pixel definition layer. The common electrode layer is disposed on the light-emitting material layer. In at least one of the driving circuit layer, the planarization layer, the pixel definition layer, and the common electrode layer, a through hole is disposed in an electronic element setup region disposed corresponding to electronic elements. Through disposing the through hole in at least one of the driving circuit layer, the planarization layer, the pixel definition layer, and the common electrode layer of the display panel and in the electronic element setup region disposed corresponding to the electronic elements, external light may not be interfere with by a layer of film having the through hole but directly passes through the layer of film having the through hole when passing through the display panel. Light transparency is thus improved, and the technical problem that poor transparency exists in conventional flexible display screens is solved.

BRIEF DESCRIPTION OF THE SEVERAL VIEWS OF THE DRAWINGS

In order to more clearly illustrate the embodiments of the present disclosure or technical solutions in conventional technologies, the drawings required for describing of the embodiments or conventional technologies will be briefly introduced below. It is obvious that the following drawings are merely some embodiments of the present disclosure, and a person having ordinary skill in this field can obtain other drawings according to these drawings under the premise of not paying creative works.

DESCRIPTION OF SPECIFIC EMBODIMENTS OF THE INVENTION

The following embodiments are described with reference to the accompanying drawings, which exemplify the realization of the present disclosure. The directional terminologies of the present disclosure, such as "top", "bottom", "front", "back", "left", "right", "inner", "outer", "side" and the like are merely the directions with reference to the accompanying drawings. Therefore, the aforesaid directional terminologies are used to describe and comprehend the present disclosure without limiting the present disclosure. In the following drawings, the units having similar structures are marked by same numerals.

Embodiments of the present disclosure are provided to solve a technical problem that poor transparency exists in conventional flexible display screens.

Figure 1:
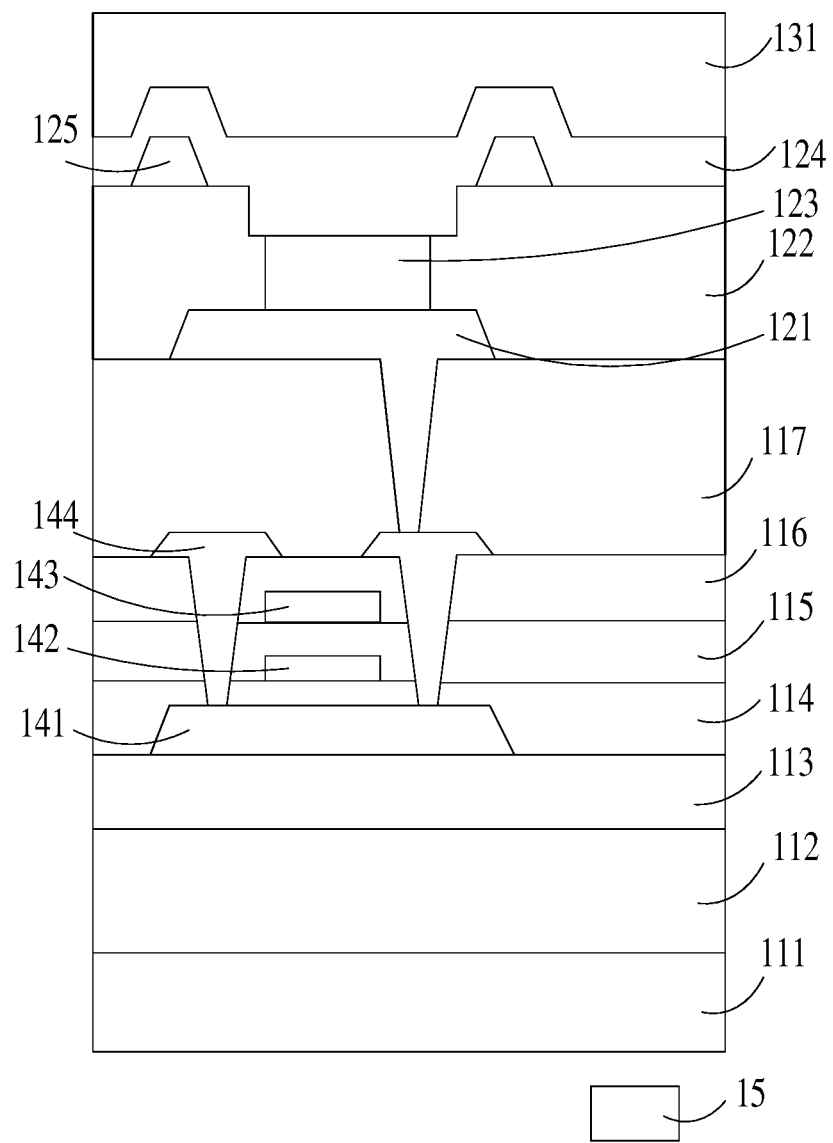
FIG. 1 is a schematic diagram of a conventional flexible, foldable mobile phone.

As shown in FIG. 1, a conventional flexible, foldable handset includes a flexible display screen and a sensor 15. The flexible display screen includes a substrate 111, a blocking layer 112, a buffer layer 113, an active layer 141, a first gate insulating layer 114, a first metal layer 142, a second gate insulating layer 115, a second metal layer 143, an interlayer insulating layer 116, a source-and-drain electrode layer 144, a planarization layer 117, an anode layer 121, a pixel definition layer 122, spacers 125, a light-emitting layer 123, a cathode layer 124, and an encapsulation layer 131. When external light is transmitted to the flexible display screen, each layer of film in the flexible display screen may interfere with the light by absorbing, reflecting, refracting, and scattering the light, which may cause difficulty for the light in reaching the sensor and thus affect the performance of the sensor. The aforesaid problem is just the technical problem that poor transparency exists in conventional flexible display screens.

Figure 2:
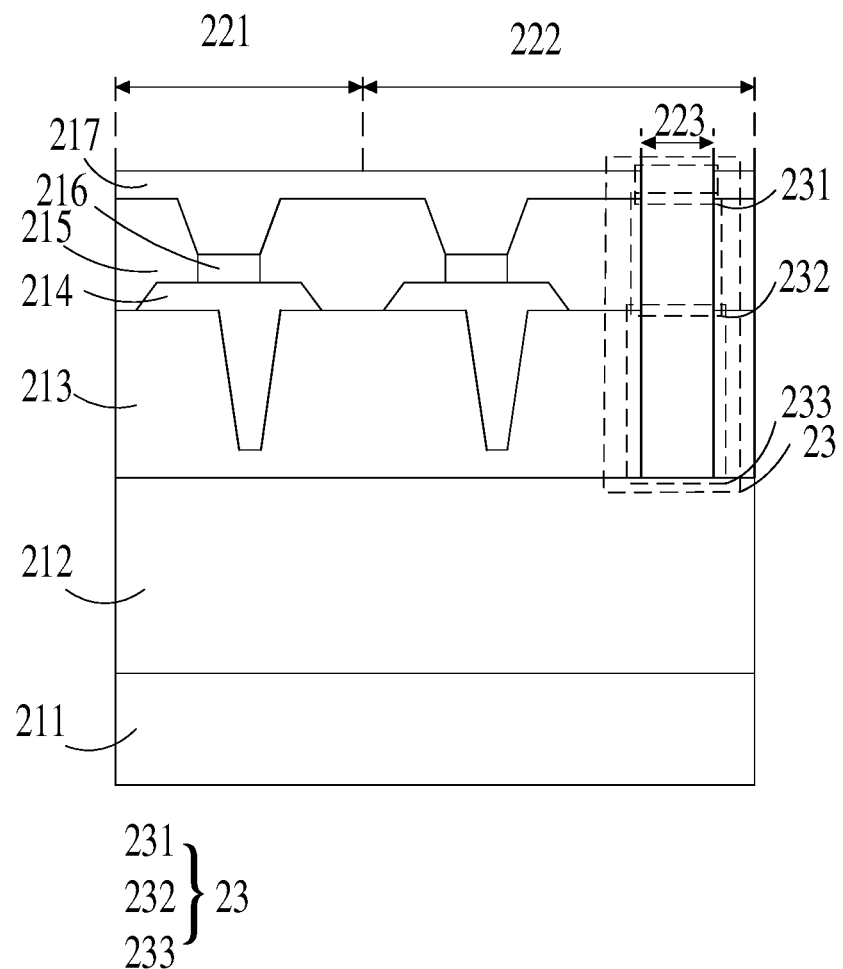
FIG. 2 is a first schematic diagram of a display panel according to one embodiment of the present disclosure.

As shown in FIG. 2, a display panel is provided in an embodiment of the present disclosure. The display panel includes:

a substrate 211;

a driving circuit layer 212 disposed on the substrate 211;

a planarization layer 213 disposed on the driving circuit layer 212;

a pixel electrode layer 214 disposed on the planarization layer 213;

a pixel definition layer 215 disposed on the pixel electrode layer 214 and defining a light-emitting region;

a light-emitting material layer 216 disposed in the light-emitting region defined by the pixel definition layer 215; and a common electrode layer 217 disposed on the light-emitting material layer 216;

wherein in at least one of the driving circuit layer 212, the planarization layer 213, the pixel definition layer 215, and the common electrode layer 217, a through hole 23 is disposed in an electronic element setup region 223 disposed corresponding to electronic elements.

A display panel is provided in an embodiment of the present disclosure. The display panel includes a substrate, a driving circuit layer, a planarization layer, a pixel electrode layer, a pixel definition layer, a light-emitting material layer, and a common electrode layer. The driving circuit layer is disposed on the substrate. The planarization layer is disposed on the driving circuit layer. The pixel electrode layer is disposed on the planarization layer. The pixel definition layer is disposed on the pixel electrode layer and defines a light-emitting region. The light-emitting material layer is disposed in the light-emitting region defined by the pixel definition layer. The common electrode layer is disposed on the light-emitting material layer. In at least one of the driving circuit layer, the planarization layer, the pixel definition layer, and the common electrode layer, a through hole is disposed in an electronic element setup region disposed corresponding to electronic elements. Through disposing the through hole in at least one of the driving circuit layer, the planarization layer, the pixel definition layer, and the common electrode layer of the display panel and in the electronic element setup region disposed corresponding to the electronic elements, external light may not be interfere with by a layer of film having the through hole but directly passes through the layer of film having the through hole when passing through the display panel. Light transparency is thus improved, and the technical problem that poor transparency exists in conventional flexible display screens is solved.

It needs to be stated that a pixel (not shown in FIG. 2) includes layers of film, and the light-emitting material layer is disposed in the light-emitting region (not shown in FIG. 2).

In an embodiment shown in FIG. 2, the display panel includes a first display region 211 and a second display region 222. The second display region 222 includes the electronic element setup region 223.

In an embodiment, a first through hole is disposed in the electronic element setup region and in the common electrode layer, causing light penetrating into the display panel through an encapsulation layer not to be reflected or absorbed by the common electrode layer when passing through the common electrode layer. The light can pass through the common electrode layer as much as possible, and thus light transparency is improved, thereby solving the technical problem that poor transparency exists in conventional flexible display screens.

In the common electrode layer of an embodiment, a width of the first through hole is equal to or greater than the width of the electronic element setup region. While the first through hole is formed in the electronic element setup region, the width of the first through hole can be prepared as being greater than the width of the electronic element setup region, causing light reaching the electronic elements through the common electrode layer to pass through the first through hole as much as possible. Thus, a loss of light caused by being reflected or absorbed is reduced, and light transparency of the display panel is improved further.

In an embodiment, the first through hole passes through the common electrode layer to form a first via-hole. As the first through hole passes through the common electrode layer, light can fully pass through the common electrode layer by passing through the first via-hole without any loss.

In an embodiment, a second through hole is disposed in the electronic element setup region and in the pixel definition layer. After passing through the common electrode layer, light is transmitted toward the electronic elements through the second through hole during the light passes through the pixel definition layer. As the light is transmitted through the second through hole without some losses, the light can more fully pass through the pixel definition layer, and thus light transparency is improved, thereby solving the technical problem that poor transparency exists in conventional flexible display screens.

In the pixel definition layer of an embodiment, a width of the second through hole is equal to or greater than the width of the electronic element setup region. As a greater incident-light angle occurs after light passes through the common electrode layer, a width of the pixel definition layer can be disposed as being greater than the width of the electronic element setup region, causing light to pass through the display panel well, instead of being blocked by side faces of the second through hole when passing through the second through hole. Thus, the light can more fully pass through the pixel definition layer, and light transparency of the display panel is improved further.

In an embodiment, the second through hole passes through the pixel definition layer to form a second via-hole. As the second through hole passes through the pixel definition layer, light can directly, fully pass through the pixel definition layer without an absorption loss. Thus, light transparency of the pixel definition layer is improved, and light transparency of the display panel is improved further.

In an embodiment, a third through hole is disposed in the electronic element setup region and in the planarization layer. After passing through the common electrode layer and the pixel definition layer, light passes through the third through hole during the light passes through the planarization layer, preventing the light from being refracted and absorbed by the planarization layer as much as possible. Thus, light transparency of the planarization layer is improved, and light transparency of the display panel is improved further.

In the planarization layer of an embodiment, a width of the third through hole is equal to or greater than the width of the electronic element setup region. As a light angle may be greater than the electronic element setup region after light passes through the common electrode layer and the pixel definition layer, the width of the third through hole can be disposed as being equal to or greater than the width of the electronic element setup region, causing the light to pass through the third through hole as much as possible. Thus, a light loss can be prevented from occurring in the planarization layer, and light transparency of the display panel is improved further.

In an embodiment, the third through hole passes through the planarization layer to form a third via-hole, leading light to fully pass through the planarization layer without any loss while the light is passing through the planarization layer.

In an embodiment, a fourth through hole is disposed in the electronic element setup region and in the driving circuit layer. In order that light passes through the driving circuit layer well, the fourth through hole can be formed in the driving circuit layer. Also, in order to prevent the fourth through hole from affecting traces of the driving circuit layer, the fourth through hole can be disposed avoiding positions of the traces, leading light to pass through the fourth through hole without affecting the driving circuit layer. Thus, light transparency of the driving circuit layer is improved, and light transparency of the display panel is improved further.

In the driving circuit layer of an embodiment, a width of the fourth through hole is greater than the width of the electronic element setup region, and the fourth through hole is not in contact with the traces of the driving circuit layer. The fourth through hole is disposed to be greater as much as possible without affecting the traces of the driving circuit layer, leading light to pass through the fourth through hole as much as possible. Thus, light transparency of the driving circuit layer is improved.

In an embodiment, the fourth through hole passes through the driving circuit layer to form a fourth via-hole, leading light passing through the fourth through hole to fully pass through the driving circuit layer. Thus, light transparency of the driving circuit layer is improved.

In an embodiment shown in FIG. 2, a first via-hole 231 is disposed in the electronic element setup region 223 and in the common electrode layer 217, a second via-hole 232 is disposed in the electronic element setup region 223 and in the pixel definition layer 215, a third via-hole 233 is disposed in the electronic element setup region 223 and in the planarization layer 213, and projections of the first via-hole 231, the second via-hole 232, and the third via-hole 233 on the substrate 211 overlap each other. Via-holes are formed in the common electrode layer, the pixel definition layer, and the planarization layer respectively, and an overlap exists among the first via-hole, the second via-hole, and the third via-hole, as a result that light can be transmitted toward the electronic elements through the first via-hole, the second via-hole, and the third via-hole. Thus, light passes through the display panel without occurring losses, and light transparency of the display panel is improved further.

In an embodiment, the fourth via-hole is disposed in the driving circuit layer, and projections of the first via-hole, the second via-hole, the third via-hole, and the fourth via-hole on the substrate overlap each other.

In an embodiment, the driving circuit layer includes a blocking layer, a buffer layer, a first gate insulating layer, a second gate insulating layer, and an interlayer insulating layer. The fourth via-hole is disposed in the blocking layer, or the fourth via-hole is disposed in the buffer layer, or the fourth via-hole is disposed in the first gate insulating layer, or the fourth via-hole is disposed in the second gate insulating layer, or the fourth via-hole is formed in the interlayer insulating layer, or the fourth via-hole is formed in any two layers of the driving circuit layer, or the fourth via-hole is formed in any three layers of the driving circuit layer, or the fourth via-hole is formed in any four layers of the driving circuit layer, or the fourth via-hole is formed in all layers of the driving circuit layer. A through hole or via-hole is formed in any layer of the driving circuit layer, leading light to pass through the driving circuit layer without occurring losses as much as possible. Thus, light transparency of the display panel is improved.

Figure 3:
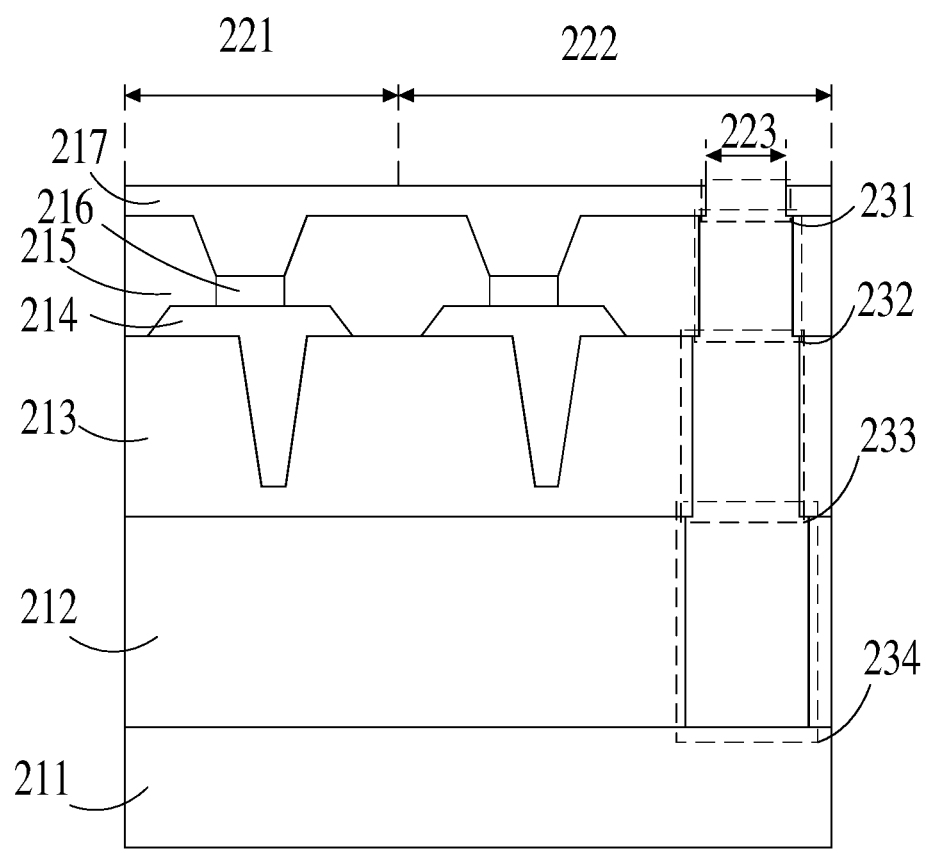
FIG. 3 is a second schematic diagram of a display panel according to one embodiment of the present disclosure.

In an embodiment shown in FIG. 3, a cross-sectional area of the fourth via-hole 234 is greater than a cross-sectional area of the third via-hole 233, a cross-sectional area of the third via-hole 233 is greater than a cross-sectional area of the second via-hole 232, and a cross-sectional area of the second via-hole 232 is greater than a cross-sectional area of the first via-hole 231. That a cross-sectional area of a via-hole is increased accordingly from a common electrode layer to a driving circuit layer causes light to pass through the through hole after an angle of the light passing a greater distance becomes large. Thus, a loss of light is avoided, and light transparency of the display panel is improved.

In an embodiment, a material of the pixel definition layer includes a light-absorbing organic material. Considering that there exists a reflection phenomenon when a light-emitting layer casts light on a cathode layer, the material of the pixel definition layer can be a light-absorbing organic material when the light penetrates the pixel definition layer. As a result, the light can only pass through the via-hole of the pixel definition layer without passing through other regions, preventing the light emitted from the light-emitting layer from affecting electronic elements. Also, the pixel definition layer can prevent external light in other regions from affecting the electronic elements.

In an embodiment, a material of the planarization layer includes a light-absorbing organic material. Considering that light is reflected and refracted to a non-electronic element setup region of the planarization layer after passing through the pixel definition layer, the light will affect the electronic elements if the light continues to be transmitted downward. The material of the planarization layer is disposed as the light-absorbing organic material, causing incoming light not from the via-hole of the planarization layer to be absorbed by the planarization layer, and thus preventing the light from interfering with the electronic elements.

Figure 4:
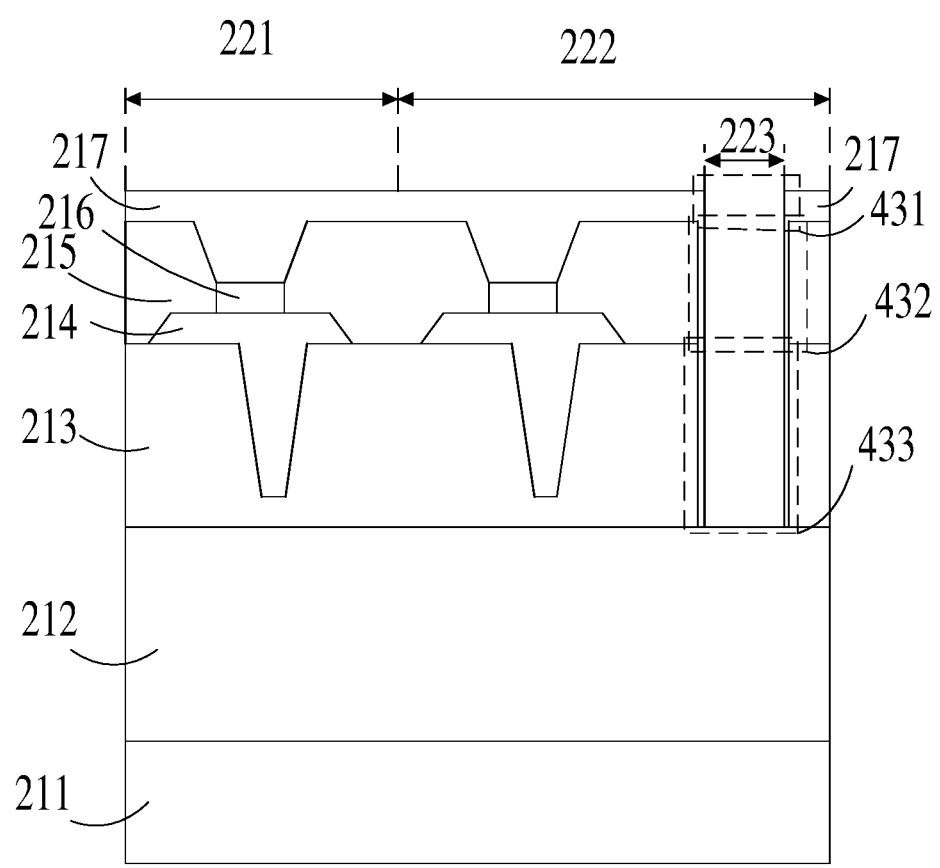
FIG. 4 is a third schematic diagram of a display panel according to one embodiment of the present disclosure.

In an embodiment shown in FIG. 4, a first via-hole 431 is disposed in the electronic element setup region 223 and in the common electrode layer 217, a second via-hole 432 is disposed in the electronic element setup region 223 and in the pixel definition layer 215, a third via-hole 433 is disposed in the electronic element setup region 223 and in the planarization layer 213. The common electrode layer 217 extends along the second via-hole 432, and the extending portion of the common electrode layer 217 sticks to the pixel definition layer 215. The common electrode layer extends toward the pixel definition layer, so that light is not absorbed or refracted by the pixel definition layer when illuminating a sidewall of the second via-hole of the pixel definition layer, but is reflected by the extending portion of the common electrode layer. As a result, the light continues to be transmitted downward, and thus a loss of light is prevented, improving light transparency of the display panel.

In an embodiment shown in FIG. 4, the common electrode layer 217 extends along the third via-hole 433, and the extending portion of the common electrode layer 217 sticks to the planarization layer 213, so that light is prevented from being absorbed by the planarization layer after the light passes through the via-hole of the pixel definition layer. Thus, absorption of light is avoided, and light transparency of the display panel is improved.

In an embodiment, the first via-hole, the second via-hole, and the third via-hole are filled with an encapsulation layer. Through filling the first via-hole, the second via-hole, and the third via-hole with the encapsulation layer, the pixel definition layer is not formed in the first via-hole when being formed after the planarization layer is formed, and the common electrode layer is not formed in the second via-hole when being formed. Thus, light can penetrate the via-holes normally, and light transparency of the display panel is improved.

Figure 5:
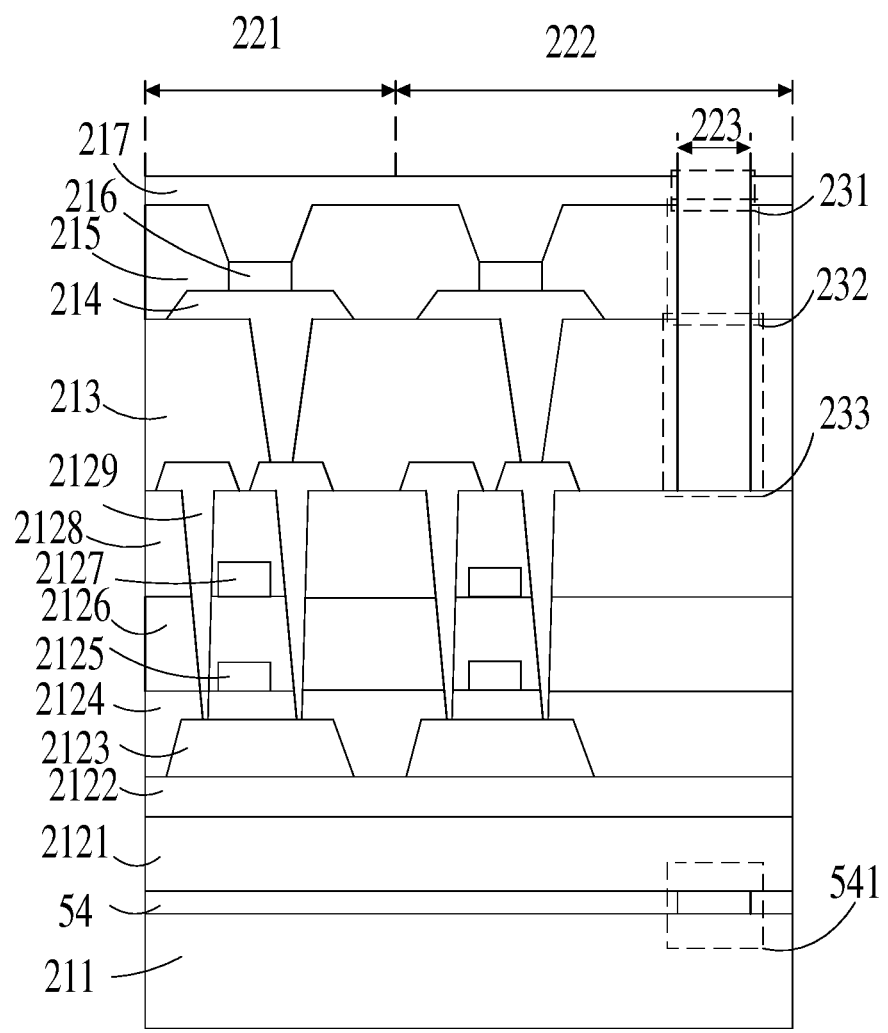
FIG. 5 is a fourth schematic diagram of a display panel according to one embodiment of the present disclosure.

As shown in FIG. 5, a light-shielding layer 54 is further included in an embodiment. The light-shielding layer 54 is disposed between the substrate 211 and the driving circuit layer 212. A fifth via-hole 541 is disposed in the electronic element setup region 233 and in the light-shielding layer 54. The light-shielding layer 54 is disposed between the substrate 211 and the driving circuit layer 212, causing external light not from the via-holes 231, 232, 233 and light emitted from the light-emitting material layer 216 to be blocked by the light-shielding layer 54. Thus, interference of the external light not from the via-holes 231, 232, 233 is prevented, and light emitted from the light-emitting material layer 216 is not prone to interfere with electronic elements. In addition, light can pass through the fifth via-hole 541, and thus the electronic elements work normally.

In an embodiment shown in FIG. 5, the driving circuit layer includes a blocking layer 2121, a buffer layer 2122, an active layer 2123, a first gate insulating layer 2124, a first gate electrode 2125, a second gate insulating layer 2126, a second gate electrode 2127, an interlayer insulating layer 2128, and a source-and-drain electrode layer 2129.

In an embodiment, a material of the light-shielding layer includes light-absorbing metal. Light is absorbed and reflected by the light-shielding layer when illuminating the light-shielding layer, preventing the light from interfering with electronic elements.

Figure 6:
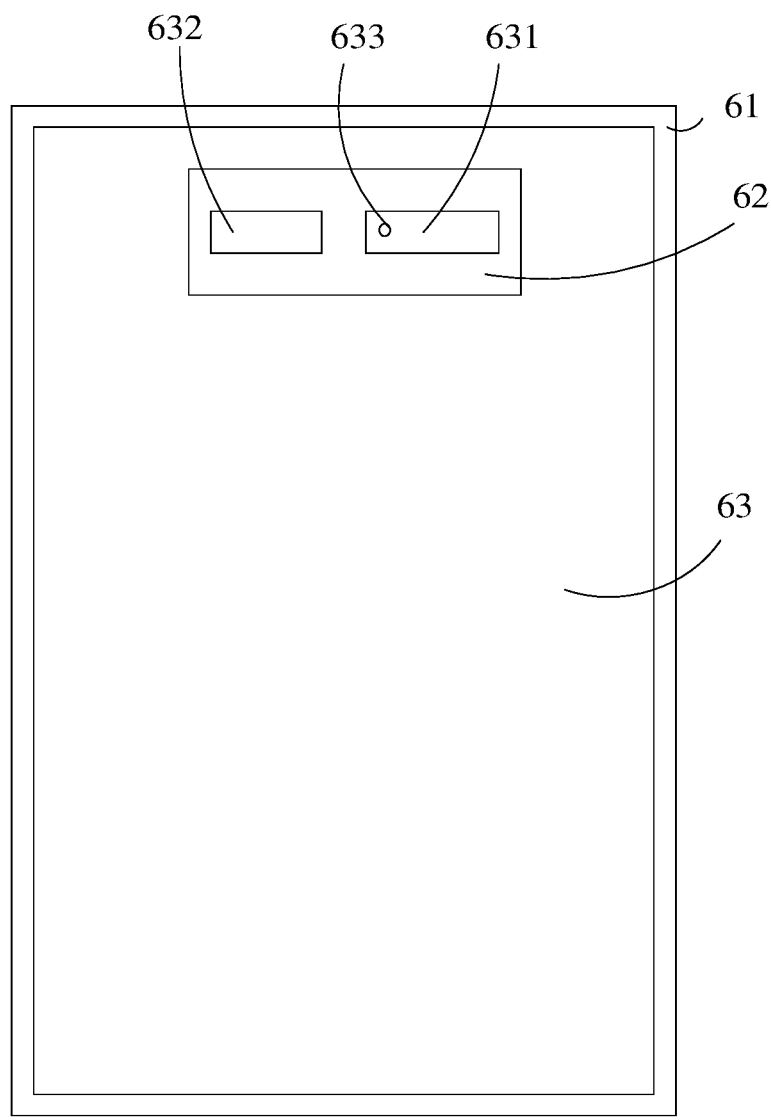
FIG. 6 is a fifth schematic diagram of a display panel according to one embodiment of the present disclosure.

As shown in FIG. 6, an embodiment of the present disclosure provides a display panel. The display panel includes a non-display region 61, a first display region 63, and a second display region 62. A first pixel 631 and a second pixel 632 are disposed in the second display region 62. A through hole 633 is disposed in the electronic element setup region corresponding to the first pixel 631 but not the electronic element setup region corresponding to the second pixel 632. Considering that the electronic element setup region may cross multiple pixels, through holes can be disposed according to the arrangement of pixels while being disposed, without disposing a through hole at each pixel. For example, in FIG. 6, it is easier to be realized that a through hole is disposed in the electronic element setup region corresponding to the first pixel but not the electronic element setup region corresponding to the second pixel. In addition, the through hole does not have greater impacts on displaying. In practical, the through hole is disposed according to the arrangement density of actual pixels or is not disposed.

Figure 7:
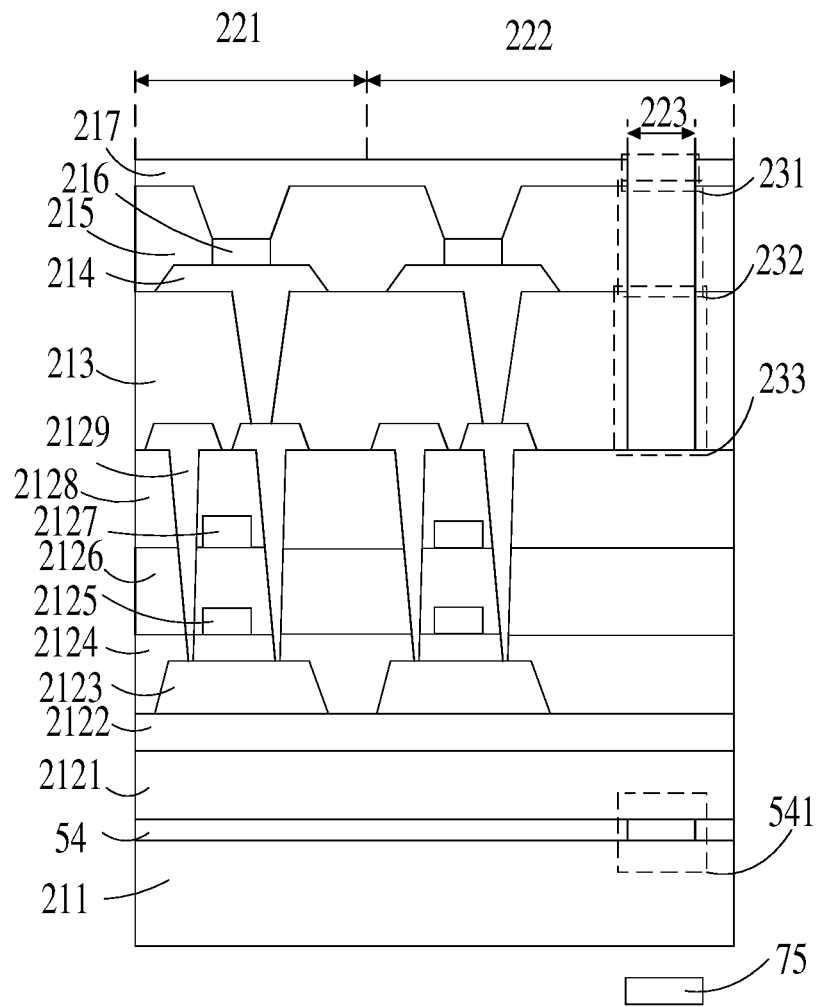
FIG. 7 is a schematic diagram of a display device according to one embodiment of the present disclosure.

As shown in FIG. 7, an embodiment of the present disclosure provides a display device, including a display panel and electronic elements 75. The display panel includes:

a substrate 211;

a driving circuit layer 212 disposed on the substrate 211;

a planarization layer 213 disposed on the driving circuit layer 212;

a pixel electrode layer 214 disposed on the planarization layer 213;

a pixel definition layer 215 disposed on the pixel electrode layer 214 and defining a light-emitting region;

a light-emitting material layer 216 disposed in the light-emitting region defined by the pixel definition layer 215; and a common electrode layer 217 disposed on the light-emitting material layer 216;

wherein in at least one of the driving circuit layer 212, the planarization layer 213, the pixel definition layer 215, and the common electrode layer 217, a through hole is disposed in an electronic element setup region 223 disposed corresponding to the electronic elements.

An embodiment of the present disclosure provides a display device, including a display panel and electronic elements 75. The display panel includes a substrate 211, a driving circuit layer 212, a planarization layer 213, a pixel electrode layer 214, a pixel definition layer 215, a light-emitting material layer 216, and a common electrode layer 217. The driving circuit layer 212 is disposed on the substrate 211. The planarization layer 212 is disposed on the driving circuit layer 212. The pixel electrode layer 214 is disposed on the planarization layer 213. The pixel definition layer 215 is disposed on the pixel electrode layer 214 and defines a light-emitting region. The light-emitting material layer 216 is disposed in the light-emitting region defined by the pixel definition layer 215. The common electrode layer 217 is disposed on the light-emitting material layer 216. In at least one of the driving circuit layer 212, the planarization layer 213, the pixel definition layer 215, or the common electrode layer 217, a through hole 23 is disposed in an electronic element setup region 223 disposed corresponding to the electronic elements 75. Through disposing the through hole 23 in at least one of the driving circuit layer 212, the planarization layer 213, the pixel definition layer 215, or the common electrode layer 217 of the display panel in the electronic element setup region 223 disposed corresponding to the electronic elements 75, external light may not be interfere with by a layer of film having the through hole 23 but directly passes through the layer of film having the through hole 23 when passing through the display panel. Light transmittance is thus improved, and the technical problem of poor transmisttance in conventional flexible display screens is solved. In other words, interference of the external light not from the via-holes is avoided, so light emitted from the light-emitting material layer 216 is prevented from interfering with electronic elements 75, and thereby thus allowing the electronic components 75 to work normally.

In an embodiment, the electronic elements are light sensors. Take a foldable display device as an example, in order to realize that the foldable display device does not display while being folded, a light sensor is disposed below the display panel. When light fails to penetrate the light sensor, the display panel is turned off, causing the display panel not to display. When the foldable display device is opened, the display panel displays and light penetrates the light sensor through the display panel. As a through hole is disposed in a region of the display panel corresponding to the light sensor, light can pass through the display panel as much as possible without occurring a loss in the display panel. Thus, the display panel displays so that the foldable display device displays normally.

In an embodiment, in order that the display panel displays when light penetrates the electronic element setup region, the size of a through hole can be allowed to be the same as that of the electronic element setup region, and a planarization layer and a pixel definition layer adopt a light-absorbing organic material. The display panel displays only when the light penetrates the electronic element setup region. Also, the display panel does not display when the light fails to penetrate the electronic element setup region.

In an embodiment, a width of a through hole can be disposed as being greater than a width of the electronic element setup region. As an arrangement region of electronic elements is smaller, light can be allowed to penetrate two sides of the electronic element setup region, causing the display panel to display or be turned off in advance.

In an embodiment, a reflection component (not illustrated) is disposed at a side face of the fifth via-hole 541, causing light emitted from a sidewall of the fifth via-hole 541 to be reflected by the reflection component without a loss.

In an embodiment, the light sensor is integrated below the substrate to reduce a thickness of the display device.

In an embodiment, in order to reduce the thickness of the display device, electronic elements 75 can be integrated to the display panel, that is, the electronic elements 75 are integrated with a bottom of the substrate 211 of the display panel, or the electronic elements 75 are disposed in a groove (not illustrated) on a side of the substrate 211 away from the driving circuit layer 212. Thus, the thickness of the display device is reduced.

It can be known according to the above embodiments:

A display panel and a display device are provided in an embodiment of the present disclosure. The display panel includes a substrate, a driving circuit layer, a planarization layer, a pixel electrode layer, a pixel definition layer, a light-emitting material layer, and a common electrode layer. The driving circuit layer is disposed on the substrate. The planarization layer is disposed on the driving circuit layer. The pixel electrode layer is disposed on the planarization layer. The pixel definition layer is disposed on the pixel electrode layer and defines a light-emitting region. The light-emitting material layer is disposed in the light-emitting region defined by the pixel definition layer. The common electrode layer is disposed on the light-emitting material layer. In at least one of the driving circuit layer, the planarization layer, the pixel definition layer, and the common electrode layer, a through hole is disposed in an electronic element setup region disposed corresponding to electronic elements. Through disposing the through hole in at least one of the driving circuit layer, the planarization layer, the pixel definition layer, and the common electrode layer of the display panel and in the electronic element setup region disposed corresponding to the electronic elements, external light may not be interfere with by a layer of film having the through hole but directly passes through the layer of film having the through hole when passing through the display panel. Light transparency is thus improved, and the technical problem that poor transparency exists in conventional flexible display screens is solved.

In conclusion, although the present disclosure has been described with reference to the foregoing preferred embodiments thereof, it is not limited to the foregoing preferred embodiments. It is apparent to those skilled in the art that a variety of modifications and changes may be made without departing from the scope of the present disclosure which is intended to be defined by the appended claims.

What is claimed is:

1. A display device, comprising a display panel and electronic elements, wherein the display panel comprises:
   a substrate;
   a driving circuit layer disposed on the substrate;
   a light-shielding layer disposed between the substrate and the driving circuit layer;
   a planarization layer disposed on the driving circuit layer;
   a pixel electrode layer disposed on the planarization layer;
   a pixel definition layer disposed on the pixel electrode layer and defining a light-emitting region;
   a light-emitting material layer disposed in the light-emitting region defined by the pixel definition layer; and
   a common electrode layer disposed on the light-emitting material layer;
   wherein in at least one of the driving circuit layer, the planarization layer, the pixel definition layer, or the common electrode layer, a through hole is defined in an electronic element setup region disposed corresponding to the electronic elements, and the through hole comprises a first-via hole, a second via-hole, a third via-hole, a fourth via-hole, and a fifth via hole, wherein the first via-hole is defined in the electronic element setup region and in the common electrode layer, the second via-hole is defined in the electronic element setup region and in the pixel definition layer, the third via-hole is defined in the electronic element setup region and in the planarization layer, the fourth via-hole is defined in the electronic element setup region and in the driving circuit layer, and the fifth via-hole is defined in the electronic element setup region and in the light-shielding layer; projections of the first via-hole, the second via-hole, the third via-hole, the fourth via-hole, and fifth via-hole projected on the substrate overlap each other; and a reflection component is disposed at a sidewall of the fifth via-hole to reflect a light from the electronic elements.

2. The display device of claim 1, wherein the electronic elements comprise a light sensor.

3. The display device of claim 2, wherein the light sensor is integrated with a bottom of the substrate.

4. The display device of claim 1, wherein a cross-sectional area of the fourth via-hole is greater than a cross-sectional area of the third via-hole, a cross-sectional area of the third via-hole is greater than a cross-sectional area of the second via-hole, and a cross-sectional area of the second via-hole is greater than a cross-sectional area of the first via-hole.

5. The display device of claim 1, wherein the first via-hole, the second via-hole, and the third via-hole are filled with an encapsulation layer.

6. The display device of claim 1, wherein a material of the pixel definition layer and the planarization layer comprises a light-absorbing organic material.

7. The display device of claim 1, wherein a material of the light-shielding layer comprises metal.

8. The display device of claim 1, wherein a first pixel and a second pixel are disposed in a second display region, and the through hole is defined in the electronic element setup region corresponding to the first pixel without corresponding to the second pixel.

9. The display device of claim 1, wherein the substrate further comprises a groove, the groove is defined in a side of the substrate away from the driving circuit layer.

10. The display device of claim 9, wherein the electronic elements are disposed in the groove.

* * * * *